United States Patent
Dast (10) Patent No.: US 8,044,480 B2
(45) Date of Patent: Oct. 25, 2011

(54) PRODUCTION OF A RADIATION DETECTOR

(75) Inventor: Patrick Dast, Saint Etienne de Crossey (FR)

(73) Assignee: Thales (FR)

( * ) Notice: Subject to any disclaimer, the term of this patent is extended or adjusted under 35 U.S.C. 154(b) by 396 days.

(21) Appl. No.: 12/065,758

(22) PCT Filed: Sep. 7, 2006

(86) PCT No.: PCT/EP2006/066116
§ 371 (c)(1),
(2), (4) Date: Mar. 18, 2008

(87) PCT Pub. No.: WO2007/036417
PCT Pub. Date: Apr. 5, 2007

(65) Prior Publication Data
US 2008/0206917 A1    Aug. 28, 2008

(30) Foreign Application Priority Data
Sep. 23, 2005  (FR) ................................... 05 09777

(51) Int. Cl.
*H01L 27/146* (2006.01)

(52) U.S. Cl. .................... 257/448; 250/370.11; 257/433
(58) Field of Classification Search .................. 250/368, 250/370.11, 483.1; 257/433, 448
See application file for complete search history.

(56) References Cited

U.S. PATENT DOCUMENTS

| | | | |
|---|---|---|---|
| 6,583,419 B1 * | 6/2003 | Moy et al. | 250/370.11 |
| 7,064,335 B2 * | 6/2006 | Suzuki et al. | 250/368 |
| 7,105,830 B2 * | 9/2006 | Nagano et al. | 250/370.11 |
| 7,402,814 B2 * | 7/2008 | Vieux et al. | 250/370.11 |
| 7,705,317 B2 * | 4/2010 | Miyaguchi | 250/370.11 |
| 2002/0121606 A1 | 9/2002 | Okada et al. | |

FOREIGN PATENT DOCUMENTS

| | | |
|---|---|---|
| FR | 2 605 166 | 4/1988 |
| FR | 2 821 671 | 9/2002 |
| FR | 2 831 671 | 5/2003 |
| JP | 63 205381 | 12/1988 |
| JP | 05148046 | 6/1993 |
| JP | 05 148046 | 9/1993 |
| JP | 2000 241553 | 1/2001 |

* cited by examiner

*Primary Examiner* — Fernando L Toledo
(74) *Attorney, Agent, or Firm* — Lowe Hauptman Ham & Berner, LLP (57) ABSTRACT

The invention relates to a method of producing a radiation detector comprising a photosensitive receiver (1; 30; 41) associated with a radiation converter (5) which is fixed by bonding to the photosensitive receiver (1; 30; 41). The method uses a film of adhesive (6; 61; 62) protected on each of its faces by a protective film and in carrying out the following operations in succession. A one protective film is removed. The film of adhesive (6; 61; 62) is laminated to the first element (5). The second protective film is removed. The second element (1; 30; 41) is brought into contact with the film of adhesive (6; 61; 62). The invention also relates to a tool for producing a radiation detector and to a method of employing this tool.

7 Claims, 7 Drawing Sheets

PRODUCTION OF A RADIATION DETECTOR

CROSS-REFERENCE TO RELATED APPLICATIONS

The present Application is based on International Application No. PCT/EP2006/066116, filed on Sep. 7, 2006, which in turn corresponds to French Application No. 09777, filed on Sep. 23, 2005, and priority is hereby claimed under 35 USC §119 based on these applications. Each of these applications are hereby incorporated by reference in their entirety into the present application.

FIELD OF THE INVENTION

The invention relates to a method of producing a radiation detector comprising a photosensitive receiver associated with a radiation converter. The invention also relates to a tool for the production of a radiation detector and to a method of employing this tool. The fields of application of this type of detector are for example the detection of X-rays used for radiology: radiography, fluoroscopy and mammography, and also for non-destructive testing and for security. The invention will be described in relation to an X-ray detector. Of course, the invention may be implemented in any type of detector for which the photosensitive receiver is not directly sensitive to the radiation to be detected and for which it is therefore necessary to interpose a radiation converter between an entry window of the detector and the photosensitive receiver.

BACKGROUND OF THE INVENTION

Such radiation detectors are known, for example from French Patent FR 2 605 166 in which a sensor formed from amorphous silicon photodiodes, forming the photosensitive receiver, is associated with a radiation converter.

The operation and the structure of such a radiation device will be briefly recalled.

The photosensitive sensor is generally produced from solid-state photosensitive elements arranged in a matrix or in a row. The photosensitive elements are produced from semiconductor materials, usually single-crystal silicon for sensors of the CCD or CMOS type, polycrystalline silicon or amorphous silicon. A photosensitive element comprises at least one photodiode, a phototransistor or a photoresistor. These elements are deposited on a substrate, generally a glass plate.

These elements are not in general sensitive directly to radiation of very short wavelengths, such as X-rays or gamma rays. This is why the photosensitive sensor is associated with a radiation converter that has a layer of a scintillating substance. This substance has the property, when it is excited by such radiation, of emitting radiation of longer wavelength, for example visible light or radiation close to the visible, to which the sensor is sensitive. The light emitted by the radiation converter illuminates the photosensitive elements of the sensor, these effecting a photoelectric conversion and delivering electrical signals that can be exploited by appropriate circuits. In the rest of the description the radiation converter will be called a scintillator.

Certain scintillating substances of the family of alkali metal halides or rare-earth oxysulfides are frequently employed for their good performance characteristics.

Among alkali metal halides, cesium iodide, doped with sodium or with thallium depending on whether emission at around 400 nanometers or around 550 nanometers is desired respectively, is known for its strong X-ray absorption and for its excellent fluorescence yield. It takes the form of fine needles which are grown on a support. These needles are approximately perpendicular to this support and partly confine the light emitted toward the sensor. Their fineness determines the resolution of the detector. Lanthanum and gadolinium oxysulfides are also widely employed for the same reasons.

However, among these scintillating substances, some have the drawback of being not very stable—they partly decompose when exposed to moisture and their decomposition releases chemical species that migrate either toward the sensor or away from the sensor. These species are very corrosive. Cesium iodide and lanthanum oxysulfide have in particular this drawback.

As regards cesium iodide, its decomposition gives cesium hydroxide $Cs^+OH^-$ and free iodine $I_2$, which can then combine with iodide ions to give the complex $I_3^-$.

As regards lanthanum oxysulfide, its decomposition gives hydrogen sulfide $H_2S$, which is chemically very aggressive.

Moisture is extremely difficult to eliminate. The ambient air and the adhesive used for assembling the detector always contain moisture. The presence of moisture in the adhesive is due either to the ambient air or as by-product of the polymerization if this results from the condensation of two chemical species, which is frequently the case.

One of the important aspects during production of these detectors will be to minimize the amount of moisture initially present inside the detector, and in contact with the scintillator, and to prevent this moisture from diffusing into the sensor during its operation.

In a first configuration, called attached-scintillator configuration, the scintillating substance is deposited on a support through which the radiation to be detected has to pass before reaching the sensor. The assembly is then bonded to the sensor.

In a second configuration, called direct-deposition configuration, the sensor serves as support for the scintillating substance, which is then in direct and intimate contact with the sensor. The scintillating substance is then covered with a protective sheet.

The two configurations each have advantages and drawbacks.

One advantage of the first configuration, the attached-scintillator configuration, is that the sensor and the scintillator are assembled only if they have been tested successfully, thereby making it possible to improve the overall manufacturing yield.

Other advantages of this configuration will become apparent on reading French Patent Application FR 2 821 671.

SUMMARY OF THE INVENTION

The invention aims to improve the manufacture of a radiation detector produced in the first configuration and, more precisely, the invention seeks to improve the bonding used in assembling the scintillator with the sensor. This bonding is currently carried out using an adhesive especially designed for its optical properties and in particular for its optical transparency at the wavelengths emitted by the scintillator. For example, a silicone-based gel is used. In addition, the quality of the image delivered by the sensor depends on the thickness of the layer of adhesive used. This is because the light radiation generated by the scintillator must pass through the layer of adhesive before being absorbed by the sensor. The dispersion of the radiation will be lower the thinner the layer of adhesive. Moreover, the dispersion of the radiation actually influences the resolution of the image, which must remain uniform over the entire area of the image. This requires depositing the adhesive with a thickness as constant as possible. To achieve this, the adhesive is currently deposited by screen printing on one or both elements to be assembled. In the case of scintillators based on cesium iodide, the layer of adhesive must have a minimum thickness so as to allow good mechanical keying and sufficient coating of the cesium iodide needles with the adhesive. Coating the cesium iodide needles is important for ensuring the quality of the optical interface between the scintillator and the adhesive.

The object of the invention is to simplify the production of detectors obtained by bonding a scintillator to a sensor.

For this purpose, one subject of the invention is a method producing a radiation detector comprising two elements: a photosensitive receiver and a scintillator that converts the radiation into radiation to which the photosensitive receiver is sensitive, the scintillator being fixed by bonding to the photosensitive receiver, characterized in that it consists in using a film of adhesive protected on each of its faces by a protective film and in that it consists in carrying out the following operations in succession:

one protective film is removed;
the film of adhesive is laminated to the first element;
the second protective film is removed; and
the second element is brought into contact with the film of adhesive.

Another subject of the invention is a tool for producing a radiation detector as described above, characterized in that the tool comprises an enclosure inside which a vacuum may be created and in that placed inside the enclosure are a support plate, on which the first element is laid, and jacks for keeping the second element a certain distance away from the first element. More precisely, this tool is used for bringing the second element into contact with the film of adhesive.

A further subject of the invention is a method of employing the tool described above, characterized in that it consists in:

placing the first element on the support plate;
removing the second protective film;
placing the jacks in the high position;
positioning the second element on the jacks;
closing the enclosure;
creating a vacuum inside the enclosure;
placing the jacks in the low position for the time required for the bonding of the two elements to be effective;
returning the inside of the enclosure to atmospheric pressure;
opening the enclosure; and
removing the detector from the tool.

By carrying out the invention, fault detection on the detectors is facilitated. This is because a screen-printing adhesive deposition method may result in a non-uniform and non-repetitive thickness of adhesive that is very difficult to detect and may lead to a continuous and local deterioration in the frequency transfer modulation well known in the literature by "FTM". However, by using a calibrated film of adhesive, the potential drawback due to a variable thickness of adhesive disappears. By implementing the invention, the only possible fault is that bubbles may be present between one of the elements and the adhesive film. The bubbles draw very visible artifacts producing a discontinuity in the modulation transfer frequency. These artifacts are therefore much more easily identifiable than the continuous deterioration in the modulation transfer frequency due to a non-uniform thickness of adhesive.

Another advantage of the invention is the improvement in modulation transfer frequency thanks to a reduction in the thickness of adhesive joining the photosensitive receiver to the scintillator. This is because, when depositing adhesive by screen printing, the minimum possible thickness is around 40 µm. There are protected films of adhesive with a thickness of 12 µm, thereby enabling the scintillator to be brought closer to the detector and therefore improving the modulation transfer frequency. In addition, the tolerance on the protected film of adhesive is much tighter than the tolerance on the thickness of a layer of adhesive deposited by screen printing, thereby improving the uniformity of the modulation transfer frequency.

Yet another advantage of the invention stems from the fact that the method is employed at room temperature. This obviates deleterious effects due to possible differences between the thermal expansion coefficients of the elements to be assembled by means of the film of adhesive.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWING

The present invention is illustrated by way of example, and not by limitation, in the figures of the accompanying drawings, wherein elements having the same reference numeral designations represent like elements throughout and wherein.

For reasons of clarity, these figures are not drawn to scale. Furthermore, the same elements will bear the same reference numerals in the various figures.

DETAILED DESCRIPTION OF THE PREFERRED EMBODIMENT

Figure 1:
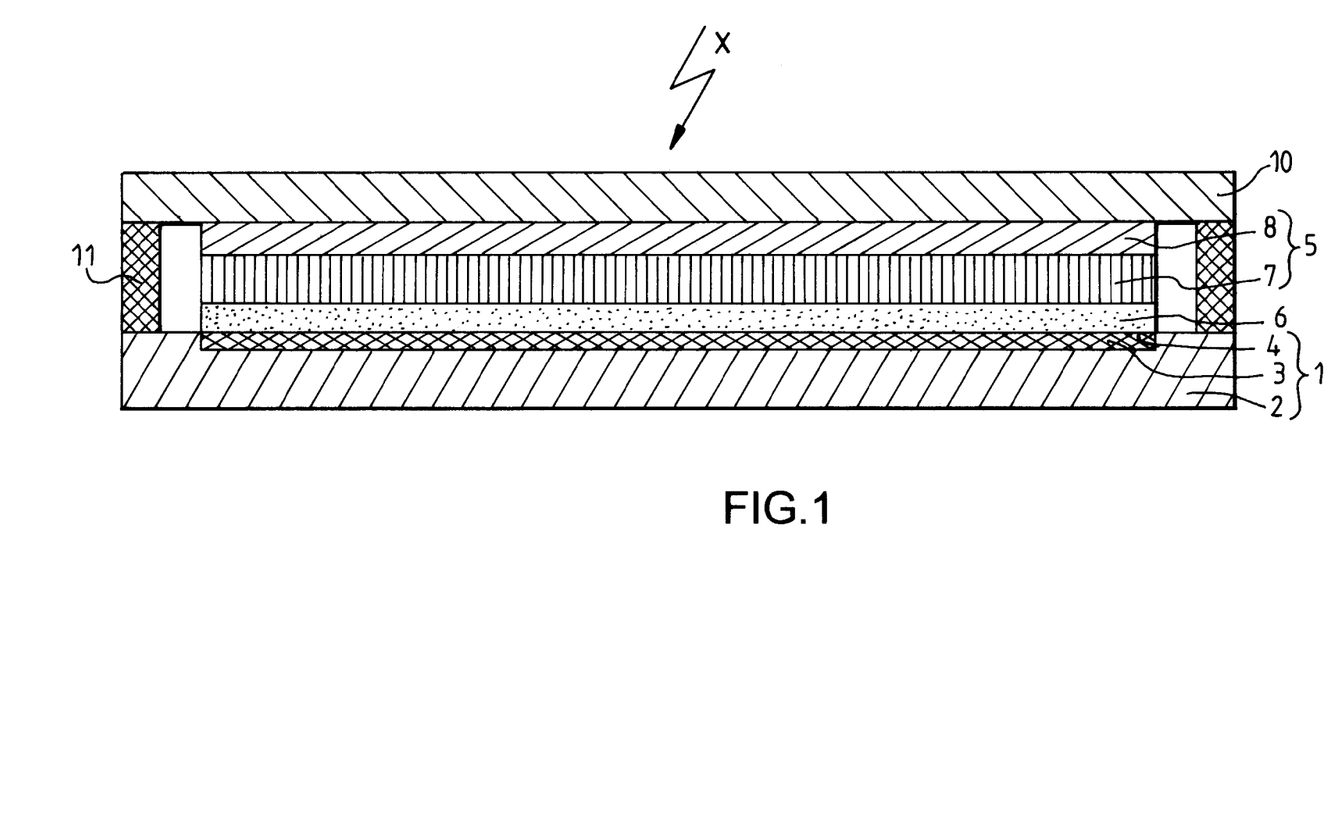
FIG. 1 shows a radiation detector used in radiology, the scintillator of which comprises cesium iodide.

FIG. 1 shows a radiation detector comprising a photosensitive sensor 1 having a substrate 2, for example formed from a glass plate, supporting photosensitive elements 3. Each photosensitive element 3 is mounted between a row conductor and a column conductor so that it can be addressed. The conductors are not visible in FIG. 1 for the sake of simplification. The photosensitive elements 3 and the conductors are generally covered with a passivation layer 4 intended to protect them from moisture. The radiation detector also includes a scintillator 5 optically coupled to the sensor 1. The optical coupling is achieved by means of a layer of adhesive 6. The scintillator 5 comprises a layer of scintillating substance 7, represented with a needle structure, deposited on a support 8. The support 8 thus supports the scintillating substance 7. The scintillating substance 7 belongs to the family of alkali metal halides such as cesium iodide which is particularly sensitive to wet oxidization.

In the radiation detector shown in FIG. 1, an entry window 10 is placed on the scintillator 5 without being fixed thereto. The radiation passes through the entry window 10 upstream of the scintillator 5. A moisture-impermeable seal 11 fixes the entry window 10 to the sensor 1, or more precisely to its substrate 2. The main advantage of placing an entry window 10 separate from the support 8 of the scintillator 5 is to improve the sealing of the radiation detector from the ambient air, to which cesium iodide is particularly sensitive. Specifically, the material of the entry window 10 is chosen in such a way that its thermal expansion coefficient is close to that of the substrate 2. This makes it possible to use a rigid seal 11 exhibiting good moisture impermeability.

Figure 2:
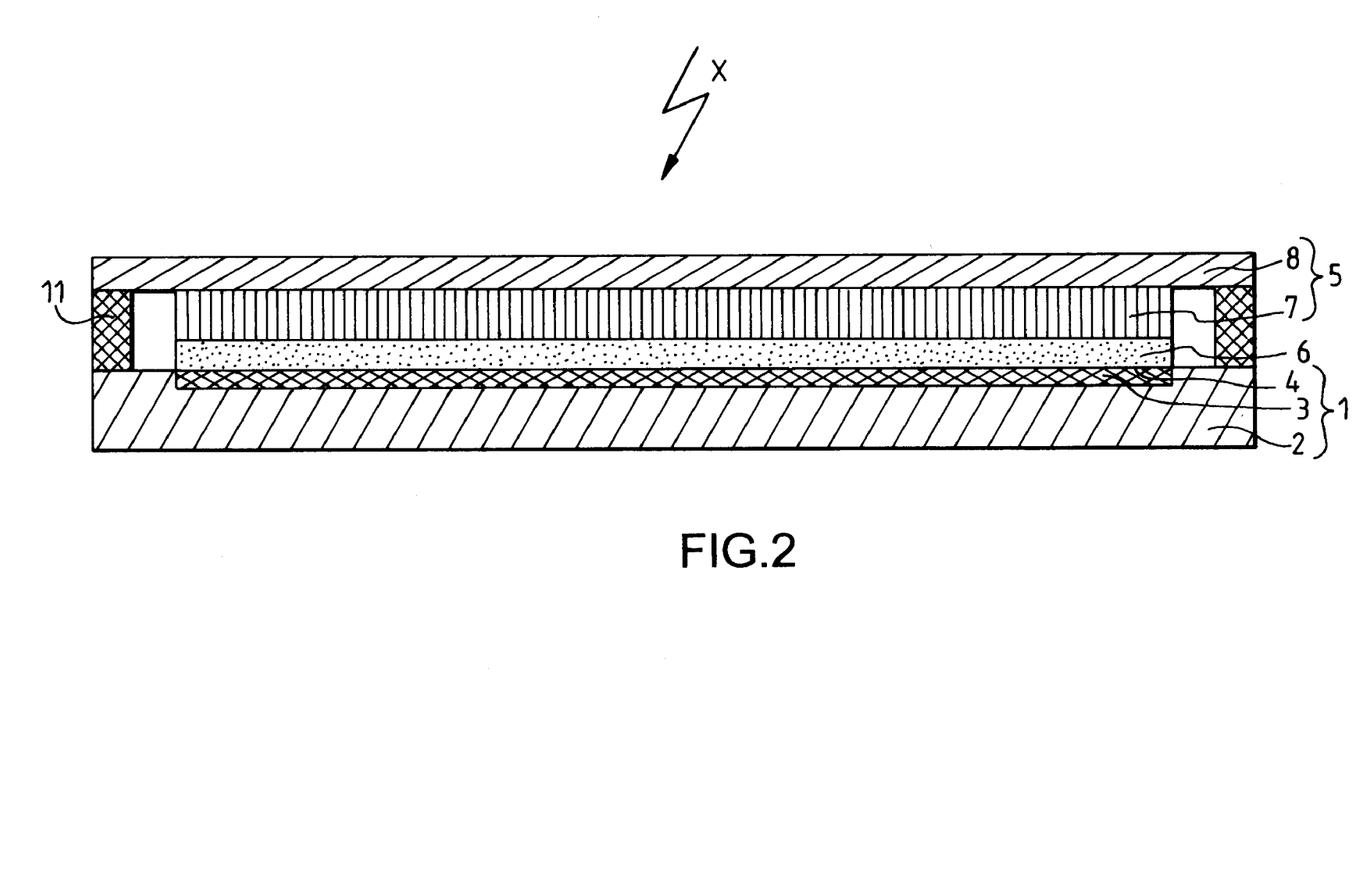
FIG. 2 shows another radiation detector used in radiology, the scintillator of which comprises gadolinium oxysulfide.

FIG. 2 shows another radiation detector used in radiology, the scintillating substance 7 of which comprises a rare-earth oxysulfide, such as for example gadolinium oxysulfide or lanthanum oxysulfide. This radiation detector comprises the same elements as the radiation detector shown in FIG. 1, with the exception of the entry window 10. This is because the scintillator 5 produced with a rare-earth oxysulfide uses a plastic binder, giving it good intrinsic sealing properties. It is therefore unnecessary to enhance the sealing of the entire radiation detector. In the radiation detector shown in FIG. 2, the entry window function is provided directly by means of the support 8 of the scintillator 5. This support is for example made of an aluminum alloy. This alloy has a thermal expansion coefficient greater than that of a substrate 2 made of glass. The seal 11 joins the support 8 to the substrate 2. Owing to the thermal expansion difference between the support 8 and the substrate 2, a flexible seal 11 will be used, for example one based on silicone which by nature is less moisture impermeable than a rigid seal 11 as described using FIG. 1.

One method for implementing the invention consists in using a film of adhesive protected on each of its faces by a protective film and in carrying out the following operations in succession:
  one protective film is removed;
  the film of adhesive is laminated to the first element (the scintillator 5 or the photosensitive sensor 1);
  the second protective film is removed; and
  the second element is brought into contact with the film of adhesive.

Figure 6:
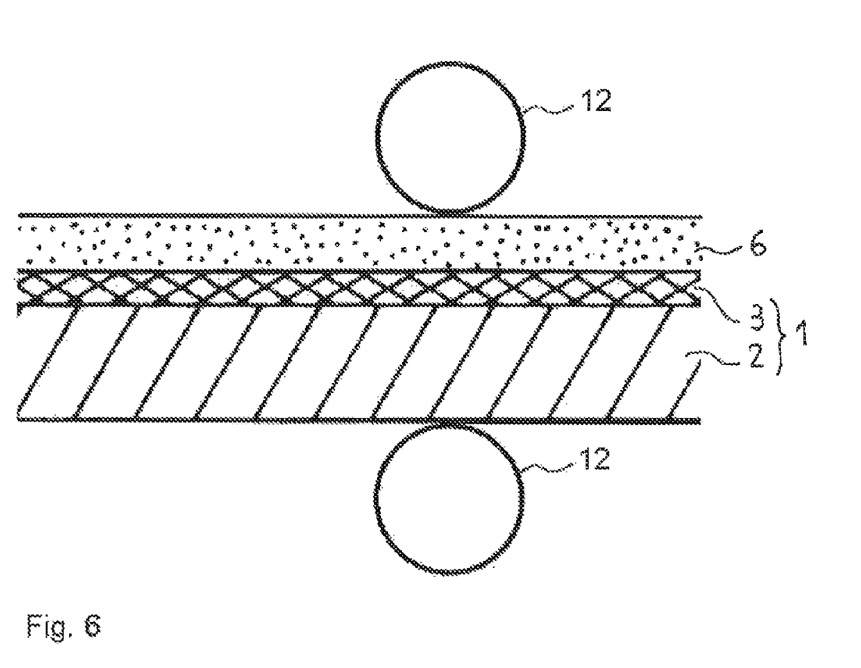
FIGS. 6 and 7 shows the film of adhesive laminated between rollers.
Figure 7:
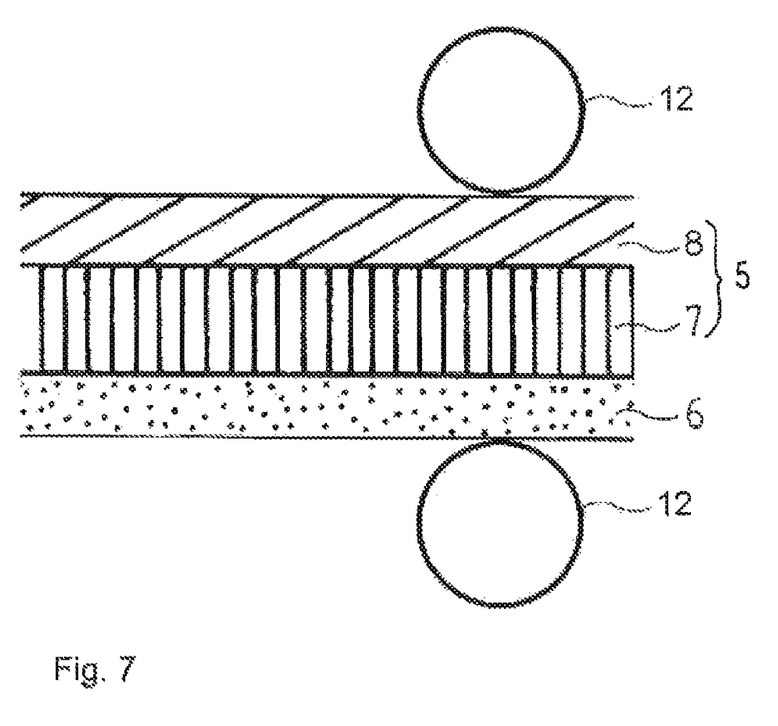

Advantageously, the film of adhesive is laminated to the first of the elements between two rollers 12 (FIGS. 6 and 7), so as to eliminate any air bubble between the element and the adhesive film.

Advantageously, before the second protective film is removed, the film of adhesive is cut according to the dimensions of the first element. This cutting may for example be carried out using a guillotine, which allows the film of adhesive to be cut to the precise dimensions of the first element.

Advantageously, the second element is brought into contact with the film of adhesive under vacuum. This vacuum method is well suited for rare-earth oxysulfides which have a smooth appearance. For scintillators belonging to the family of alkali metal halides, such as cesium iodide, carrying out the bonding under vacuum is less necessary since this family of scintillating substances has a microporous appearance, making it possible for any air bubbles retained between the film and the scintillator 5 to be eliminated naturally.

Advantageously, the film of adhesive is acrylic based.

Figure 3:
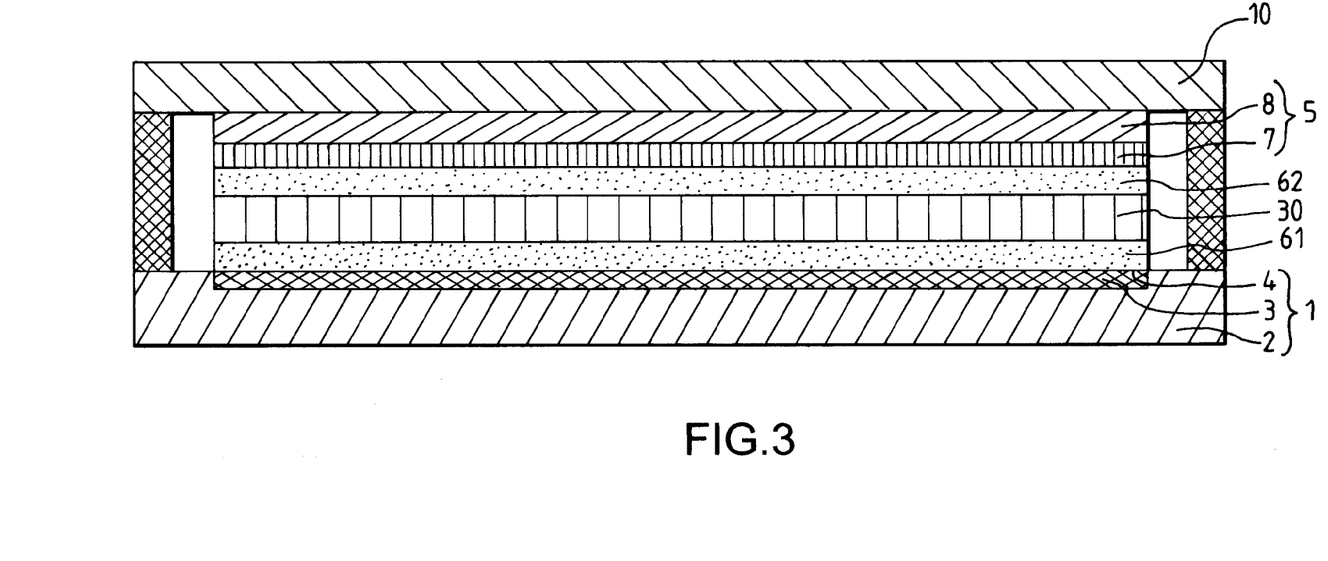
FIG. 3 shows a radiation detector that includes an intermediate element between the scintillator and the sensor.

FIG. 3 shows a radiation detector similar to that of FIG. 1, in which a fibre-optic faceplate 30 is inserted between the photosensitive sensor 1 and the scintillator 5. The optical coupling between the photosensitive sensor 1 and the fibre-optic faceplate 30 is achieved by means of a layer of adhesive 61. Likewise, the optical coupling between the scintillator 5 and the fibre-optic faceplate 30 is achieved by means of a layer of adhesive 62, it being possible for both adhesive films 61 and 62 to be put in place using a method according to the invention. It is also possible to employ such a fibre-optic faceplate 30 in a radiation detector as described in FIG. 2 in which the scintillating substance 7 is directly placed on the entry window 8. The fibre-optic faceplate 30 is used to guide the radiation from the scintillator 5 to the photosensitive sensor 1. The fibre-optic faceplate 30 may be replaced with an electrooptic material based on amorphous selenium, allowing the radiation from the scintillator 5 to be amplified.

Figure 4:
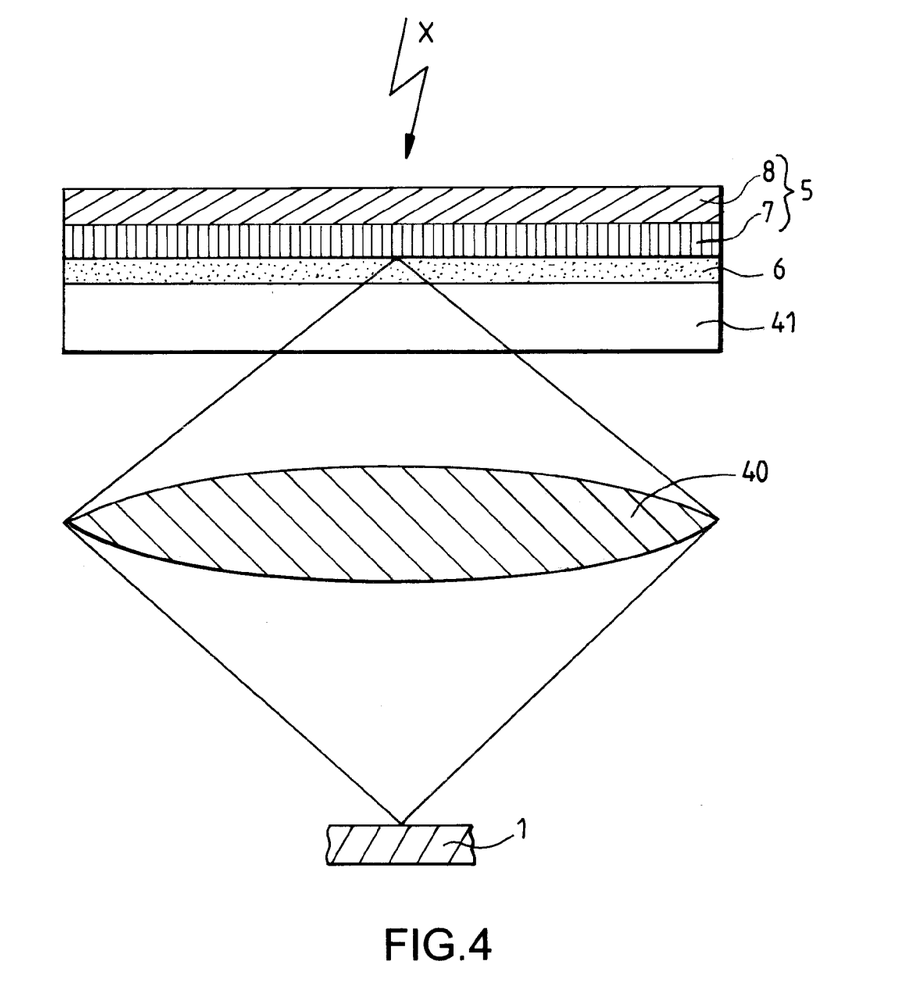
FIG. 4 shows a radiation detector in which the scintillator is optically coupled to the sensor via a lens.

FIG. 4 shows a radiation detector that includes an optical device 40 for focussing the radiation from the scintillator 5 onto the photosensitive sensor 1. This radiation detector furthermore includes a plate 41 transparent to the radiation from the scintillator 5 and forming the photosensitive receiver. The optical coupling between the plate 41 and the scintillator 5 is achieved by means of a layer of adhesive 6 that may be put in place using a method according to the invention.

Figure 5:
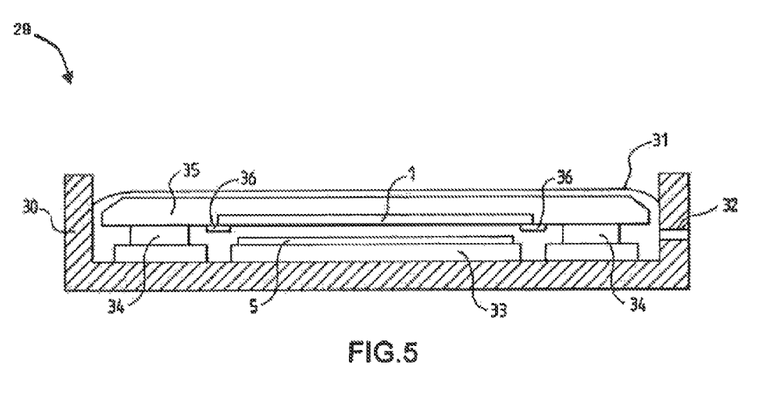
FIG. 5 shows a tool for the production of a radiation detector.

FIG. 5 shows a tool 29 for the production of a radiation detector.

The tool 29 comprises a body 30 with a screen 31 which together form an enclosure inside which a vacuum may be created, for example by means of a channel 32 intended to be connected to a vacuum pump (not shown in the figure). Placed inside the enclosure are a support plate 33, on which the first element is laid, for example the scintillator 5, and jacks 34 for keeping the photosensitive receiver 1 a certain distance away from the scintillator 5. In FIG. 3, the jacks 34 are shown in the high position. They thus keep the photosensitive receiver 1 a certain distance away from the scintillator 5. When the jacks 34 come into the low position, contact between the photosensitive receiver 1 and the scintillator 5 is possible. The photosensitive receiver 1 is positioned in a recess made in a support 35 placed on the jacks 34. The photosensitive receiver 1 is held in place on the support 35 by fingers 36 integral with the support 35. To ensure that the photosensitive receiver 1 and the scintillator 5 are in correct relative positions, the support is centered with respect to the body 30.

To employ the tool 29 described using FIG. 3, the following operations are carried out in succession:
  the scintillator 5 is placed on the support plate 33. At this stage in the production of the detector, the scintillator 5 is already covered with the film of adhesive;
  the second protective film is removed;
  the jacks 34 are placed in the high position;
  the photosensitive receiver 1 is positioned on the jacks 34. More precisely, the support 35, on which the photosensitive receiver 1 has been mounted beforehand, is placed on the jacks 34;
  the enclosure is closed by fixing the screen 31 to the body 30;
  a vacuum is created inside the enclosure;
  the jacks 34 are placed in the low position for the time required for the bonding of the two elements to be effective. The bonding time is for example of the order of a few minutes;
  the inside of the enclosure is returned to atmospheric pressure;
  the enclosure is opened; and
  the detector is removed from the tool.

It will be readily seen by one of ordinary skill in the art that embodiments according to the present invention fulfill many of the advantages set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The invention claimed is:

1. A method of producing a radiation detector having a photosensitive receiver and a scintillator, the scintillator converting received radiation into radiation to which the photosensitive receiver is sensitive, the scintillator being bonded to the photosensitive receiver, the method comprising:
   removing a first protective film from a first face of an adhesive film;
   laminating the first face of the adhesive film to a first element comprising one of the photosensitive receiver and the scintillator;
   removing a second protective film from a second face of the adhesive film opposite from the first face; and
   bringing a second element, the other of the photosensitive receiver and the scintillator, into contact with the second face of the adhesive film.

2. The method as claimed in claim 1, further comprising cutting the adhesive film according to the dimensions of the first element before the second protective film is removed.

3. The method as claimed in claim 1, wherein the second element is brought into contact with the film of adhesive under vacuum.

4. The method as claimed in claim 1, wherein the adhesive film is acrylic based.

5. The method as claimed in claim 1, wherein the lamination is carried out between two rollers.

6. A tool for implementing the method according to claim 1, wherein the tool comprises:
   an enclosure further comprising a support plate disposed therein on which the first element is laid, and jacks for keeping the second element a certain distance away from the first element, wherein the enclosure has a vacuum formed therein.

7. A method of employing a tool according to claim 6, comprising:
   placing the first element on the support plate;
   removing the second protective film;
   placing the jacks in a high position;
   positioning the second element on the jacks;
   closing the enclosure;
   creating a vacuum inside the enclosure;
   placing the jacks in a low position for a time required for the bonding of the two elements;
   returning the inside of the enclosure to atmospheric pressure;
   opening the enclosure; and
   removing the radiation detector from the tool.

* * * * *